US008415962B2

(12) United States Patent
Shan et al.

(10) Patent No.: US 8,415,962 B2

(45) Date of Patent: Apr. 9, 2013

(54) TRANSMISSION LINE BASED ELECTRIC FENCE WITH INTRUSION LOCATION ABILITY

(76) Inventors: Xuekang Shan, San Diego, CA (US); Jin Hao, San Diego, CA (US); Runbao Hao, Jin Zhong (CN)

( * ) Notice: Subject to any disclaimer, the term of this patent is extended or adjusted under 35 U.S.C. 154(b) by 318 days.

(21) Appl. No.: 12/954,704

(22) Filed: Nov. 26, 2010

(65) Prior Publication Data

US 2012/0133377 A1 May 31, 2012

(51) Int. Cl.

| | |
|---|---|
| ***G01R 27/08*** | (2006.01) |
| ***A01K 3/00*** | (2006.01) |
| ***G08B 13/26*** | (2006.01) |

(52) U.S. Cl.

USPC .............................. 324/713; 256/10; 340/564

(58) Field of Classification Search .................. 324/713, 324/691, 649, 600, 522, 329, 300, 326, 323, 324/637, 629, 314, 307, 76.11; 256/10; 340/564, 340/561, 552, 551, 543; 342/27, 28

See application file for complete search history.

(56) References Cited

U.S. PATENT DOCUMENTS

| | | | | |
|---|---|---|---|---|
| 4,523,187 | A * | 6/1985 | Begg | 340/661 |
| 6,801,045 | B2 * | 10/2004 | Hamm et al. | 324/713 |
| 2003/0189432 | A1 * | 10/2003 | Montreuil | 324/649 |
| 2004/0257218 | A1 * | 12/2004 | Shibata et al. | 340/522 |
| 2009/0243915 | A1 * | 10/2009 | Nishizato et al. | 342/175 |
| 2012/0181258 | A1 * | 7/2012 | Shan et al. | 219/200 |
| 2012/0223282 | A1 * | 9/2012 | Hao et al. | 256/10 |

* cited by examiner

*Primary Examiner* — Hoai-An D Nguyen

(74) *Attorney, Agent, or Firm* — John R. Ross; John R. Ross, III

(57) ABSTRACT

An electric security fence. An electric signal generator generates an initial electric signal. The generated initial electric signal is transmitted through a transmission line. The transmission line will generate a reflected electric signal when the transmission line is disturbed by the presence of a human or animal at a disturbance area. A receiver receives the reflected electric signal and forwards it to a signal processing unit. The signal processing unit calculates the location of the disturbance area after receiving the reflected electric signal. In one preferred embodiment, the signal processing unit calculates the location of the disturbance area by determining the amount of time required for the reflected signal to travel from the disturbance area. In another preferred embodiment, the signal processing unit calculates the location of the disturbance area by determining the frequency difference between an initial Frequency Modulated Continuous Wave signal and the reflected Frequency Modulated Continuous Wave signal. In another preferred embodiment the transmission wire is utilized to send coded communication signals and distance information back to a base station for monitoring and information transmission.

11 Claims, 6 Drawing Sheets

TRANSMISSION LINE BASED ELECTRIC FENCE WITH INTRUSION LOCATION ABILITY

The present invention relates to security fences, and in particular, to electric security fences that can determine the location of an intruder.

BACKGROUND OF THE INVENTION

Electric fences are known and are widely used for security purposes and for animal control. Prior art electric fences utilize metal wires surrounding an area to be protected. The most common prior art electric fences include a high voltage energizer which generates short high voltage pulses that propagate down one or more metal wires forming the fence when one or more of the wires are touched. When an animal or intruder touches one of such wires, an electric current path is formed between the wire and ground. This current has two effects: 1) the animal/intruder will receive an electric shock and may be repelled or deterred, and 2) this current is sensed by the terminal equipment and an alarm signal is triggered for the attention of security personnel.

In many situations, especially where the electric fences are used for security purposes, information of the intrusion location is desired or even is essential. However, the most common electric fences do not have the ability to locate an intrusion. A prior art method exists that divides the whole length of the fence into many shorter zones. Each zone has its own terminal equipment and thus can send out alarm signals for the zone. The smaller the zone, the more accurately the intrusion is located. While somewhat effective, the prior art zone electric security fence is very expensive and includes complex wiring and a complicated operating system.

What is needed is a better electric security fence.

SUMMARY OF THE INVENTION

The present invention provides an electric security fence. An electric signal generator generates an initial electric signal. The generated initial electric signal is transmitted through a transmission line. The transmission line will generate a reflected electric signal when the transmission line is disturbed by the presence of a human or animal at a disturbance area. A receiver receives the reflected electric signal and forwards it to a signal processing unit. The signal processing unit calculates the location of the disturbance area after receiving the reflected electric signal. In one preferred embodiment, the signal processing unit calculates the location of the disturbance area by determining the amount of time required for the reflected signal to travel from the disturbance area. In another preferred embodiment, the signal processing unit calculates the location of the disturbance area by determining the frequency difference between an initial Frequency Modulated Continuous Wave signal and the reflected Frequency Modulated Continuous Wave signal. In another preferred embodiment the transmission wire is utilized to send coded communication signals and distance information back to a base station for monitoring and information transmission.

DETAILED DESCRIPTION OF THE PREFERRED EMBODIMENTS

Figure 1:
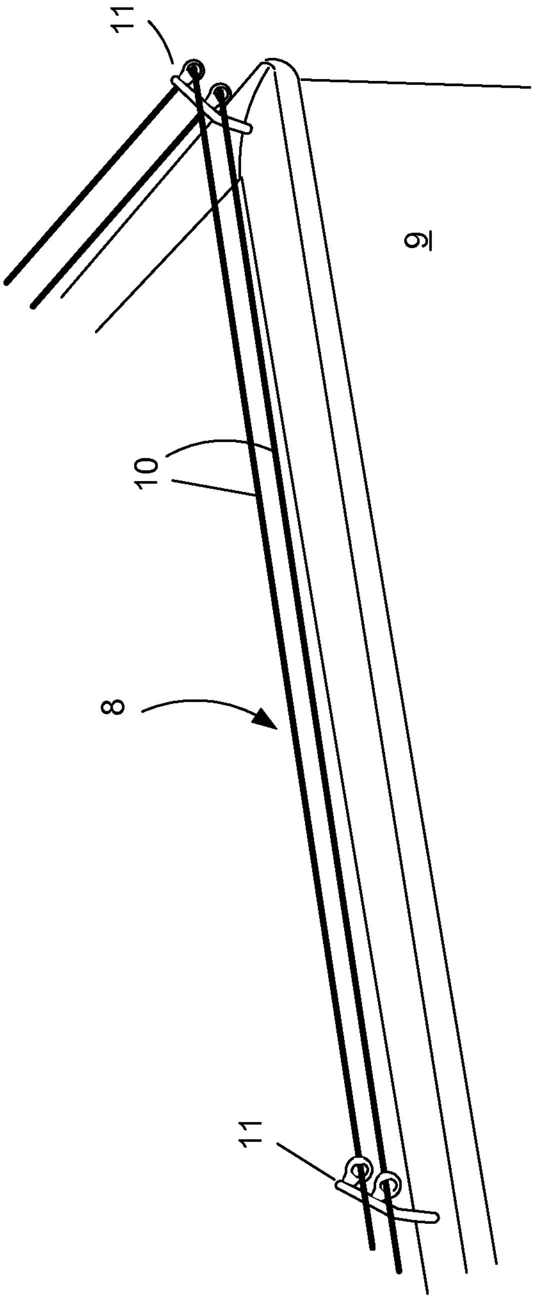
FIG. 1 shows a perspective view of preferred transmission line mounted on a wall.

FIG. 1 shows electric fence 8 installed over wall 9. Electric fence 8 includes transmission line 10. Transmission line 10 is supported by insulators 11. By utilizing reflected electric transmission line signals, electric fence 8 is able to locate an intruder with an accuracy as high as a few meters and with a range of up to tens of km.

First Preferred Embodiment

Figure 2:
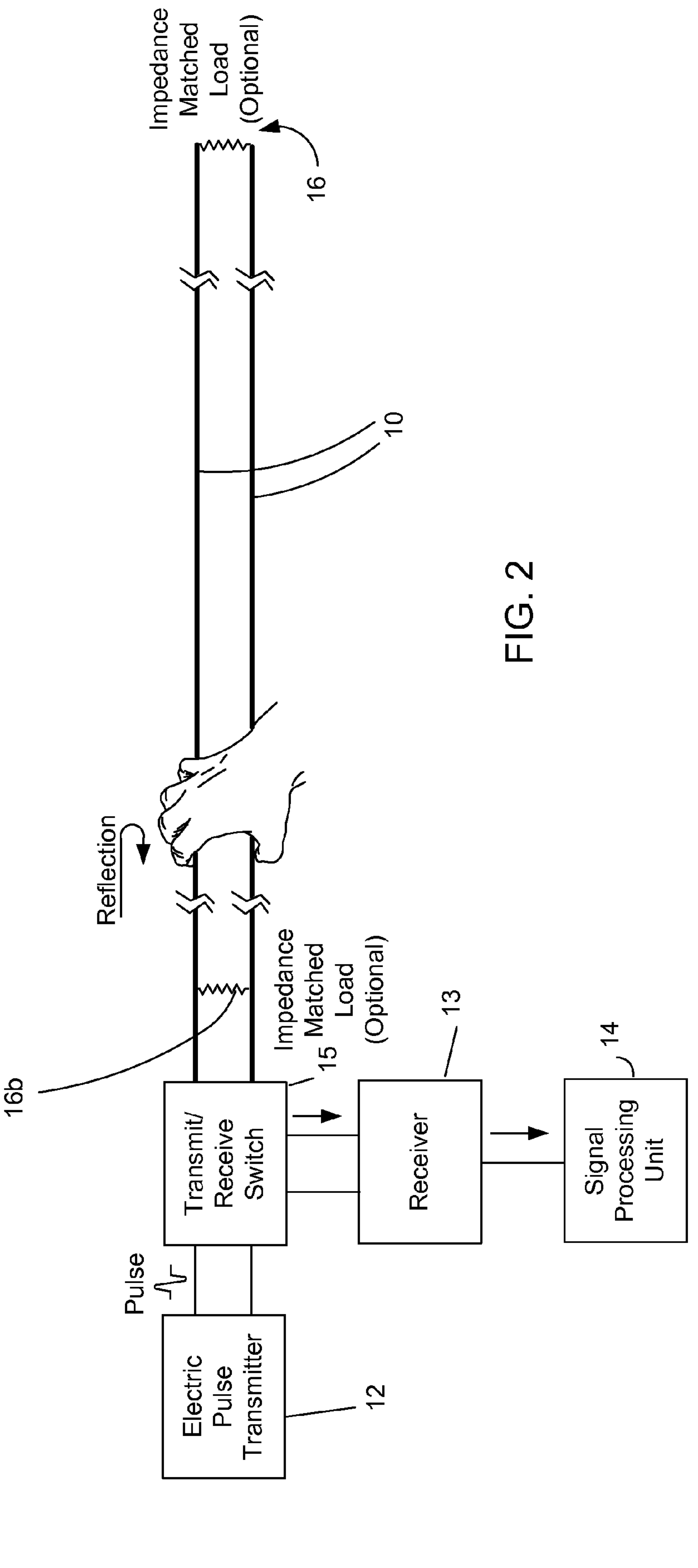
FIG. 2 shows a preferred embodiment of the present invention.

As shown in FIG. 2, electric fence 8 includes electric pulse transmitter 12, transmission line 10, electric signal receiver 13, transmit/receive switch 15 and signal processing unit 14. Electric pulse transmitter 12 launches short pulses into transmission line 10 with a given time interval. Preferably the transmitted pulse is sent as a short pulse (normally a single cycle or multiple cycles). Impedance matched loads 16 and 16*b* are connected to transmission line 10 as shown. During normal operation, the pulse generated by electric pulse transmitter 16 propagates along transmission line 10 and is absorbed at the end of the line by the impedance matched load 16. No energy is reflected along the path, and receiver 13 will not see any signal. In the case of an intrusion, by touching transmission line 10 the intruder causes a reflection which is received by the receiver. Since only a portion of the power is reflected by the intrusion, these impedance matched loads 16 and 16*b* prevent multiple reflections between receiver 13 and the intrusion point and between the intrusion point and the end of transmission line 10. Therefore, it is possible to detect more than one simultaneous intrusion.

It should be noted that impedance matched loads 16 and 16*b* are optional. The end of the transmission line 10 can also be shortened, or left open. The beginning of the line can be connected to the terminal equipment only without an impedance matched load. In any of these cases, there will be fixed reflection from the end, and there will be multiple reflections. Therefore it will be more difficult to detect more than one simultaneous intrusion.

When an intruder tries to climb over the fence, he will inevitably approach and then may be touch transmission line 10 or cause the distance between the two wires of transmission line 10 to change.

In either case, transmission line 10 will exhibit an impedance mismatch at the point of intrusion (FIG. 2). This impedance mismatch causes a portion of the electric pulse to reflect back towards electric signal receiver 13. When electric signal receiver 13 receives a reflected signal, the distance of the intrusion from the receiver (L is the distance) can be calculated from time of flight and the intrusion can thus be located.

$$L = \frac{\Delta t}{2} \cdot C$$

Where C is the speed of pulse propagation ($3\times10^8$ m/s), and where $\Delta t$ is the time interval between the launched pulse and the received reflected energy.

Signal processing unit 14 processes the received signal, and sends out alarms when necessary. In a preferred embodiment, signal processing unit 14 is programmed to analyze the received signal to make a determination as to what type of disturbance it might be: accidental touch, intentional intrusion, or a cut of the wire(s).

The two wires of transmission line 10 are symmetric to ground. Therefore, even if the intruder touches only one of the two wires, this symmetrization is affected and a portion of the launched energy will be reflected back towards electric signal receiver 13. The intrusion can still be detected and located as explained above.

Transmission Line

As shown in FIG. 2, transmission line 11 preferably includes two parallel transmission wires. The transmission line has characteristic impedance $Z_0$, which is determined by $$Z_0 \approx 276\log_{10}\left(2\frac{D}{d}\right)$$

where D is the distance between the axis of the two wires, and d the diameter of the wires. The unit for $Z_0$ is ohm.

The reflection coefficient equation:

$$\Gamma = \frac{Z_L - Z_0}{Z_L + Z_0}$$

where $Z_L$ is the effective impedance of the intrusion point, and $Z_O$ the characteristic impedance of the transmission line.

When an electric pulse with a voltage $V_0^+$ propagates down the transmission line, part of the pulse is reflected back at the point of intrusion towards the receiver with a voltage of $$V_0^- = \Gamma V_0^+$$

Transmission line 11 is terminated by a load resistor which is equal to the characteristic impedance $Z_O$;

Prototype

Figure 5:
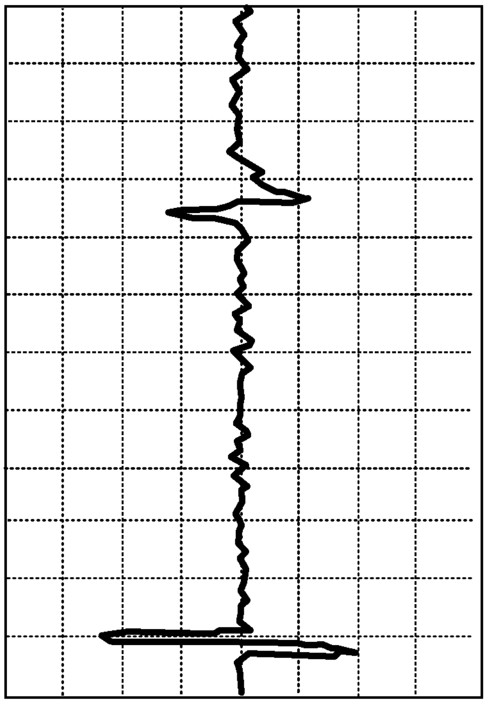
FIG. 5 shows an oscilloscope display of a tested prototype.

A prototype of the embodiment shown in FIG. 2 has been built and tested. Gauge 17 aluminum wire was set 5 cm apart for transmission wire 10. The characteristic impedance of the wire pair was approximately 535 ohm. FIG. 5 shows an oscilloscope display caused by a human hand gripping both wires of transmission wire 10. The launched pulse from pulse transmitter 12 was a single cycle pulse at 15 MHz. As shown in FIG. 5, the first voltage peak was the transmitted signal and the second voltage peak was the received signal. The time between these two signals was approximately 7.6×200 ns=1500 ns. Therefore the distance of the intruder was approximately 228 meters from receiver 13. The distance resolution achieved was approximately 3 meters.

Other Preferred Embodiment

Figure 3:
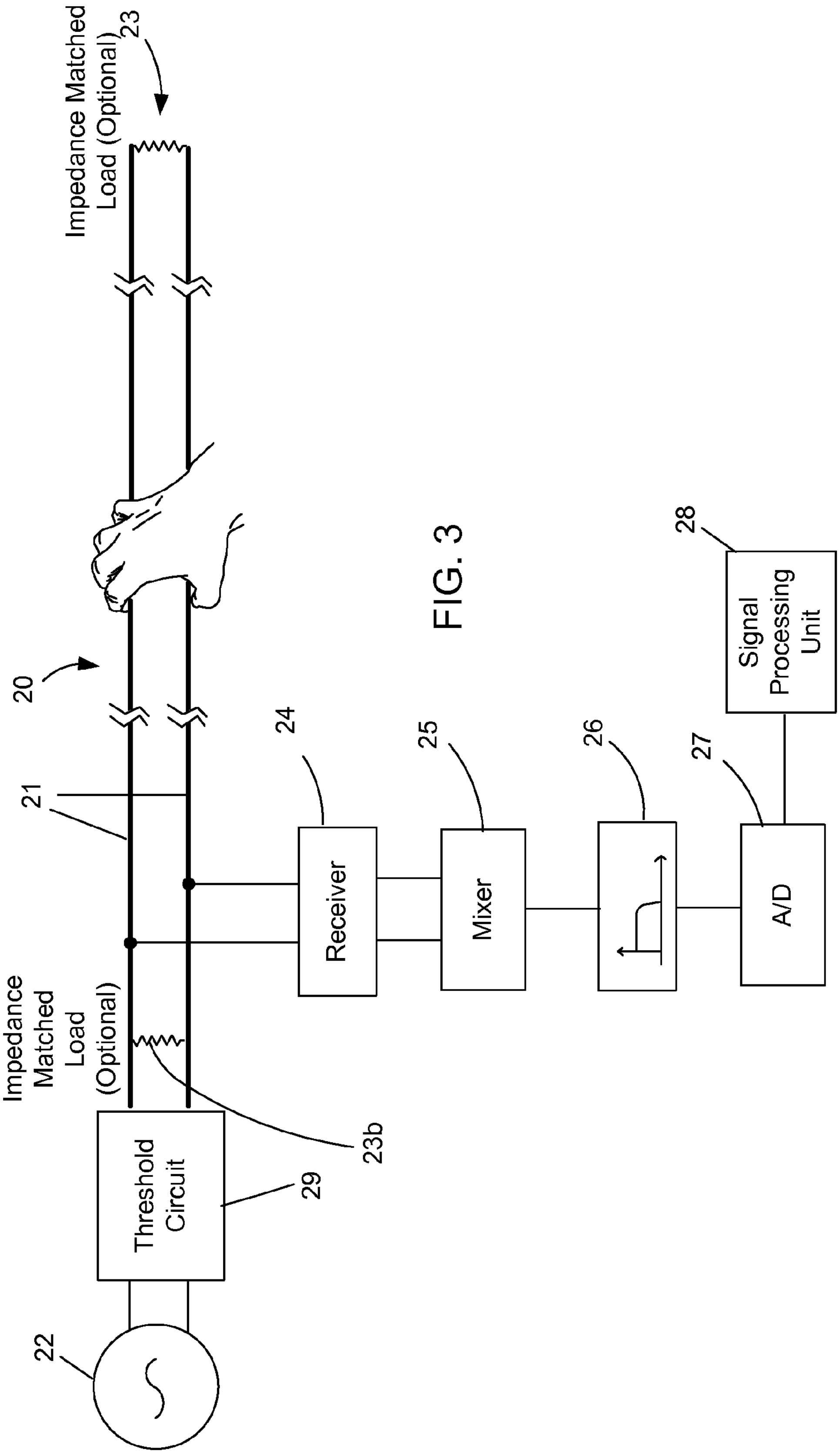
FIG. 3 shows another preferred embodiment of the present invention.

Another preferred embodiment of the present invention is shown in FIG. 3. In FIG. 3, electric fence 20 utilizes Frequency Modulated Continuous Wave (FMCW) radar/sensor technology. In this embodiment, the signal source 22 is a FMCW generator. The FMCW signal is launched into transmission line 21 through threshold circuit 29. During normal operation, the pulse generated by FMCW signal source 22 propagates along transmission line 21 and is absorbed at the end of the line by the impedance matched load 23. No energy is reflected along the path, and receiver 24 will not see any signal. When an intruder touches transmission line 21 at a point, there will be reflection of the FMCW signal towards receiver 24. Since the signal is frequency modulated, that is the instantaneous frequency varies with time, the reflected signal has a different frequency from that of the forward going signal when they meet at receiver 24. Receiver 24 then passes both signals to frequency mixer 25, which generates the difference of the two signals and other higher order frequency components. The low pass filter 26 that follows mixer 25 only lets the different components pass through. The filtered signal is then converted into a digital signal by A/D converter 27. Signal processing unit 28 utilizes Fast Fourier Transforms (FFT) to calculate the frequency of the digital signal. From this frequency, the distance of the intrusion (L is the distance) is determined.

$$L = \frac{\Delta f}{2R} \cdot C$$

Where C is the speed of pulse propagation ($3\times10^8$ m/s), and where R is the frequency change rate (Hz/s), and where $\Delta f$ is the frequency difference.

For example, the frequency modulation is to change the frequency by 1 kHz per micro second. If the reflected back signal has a 2 kHz frequency difference from the fresh signal generated by the transmitter, the intrusion distance is 300 m.

Using Transmission Line to Transmit Signals to a Base Station

Figure 4:
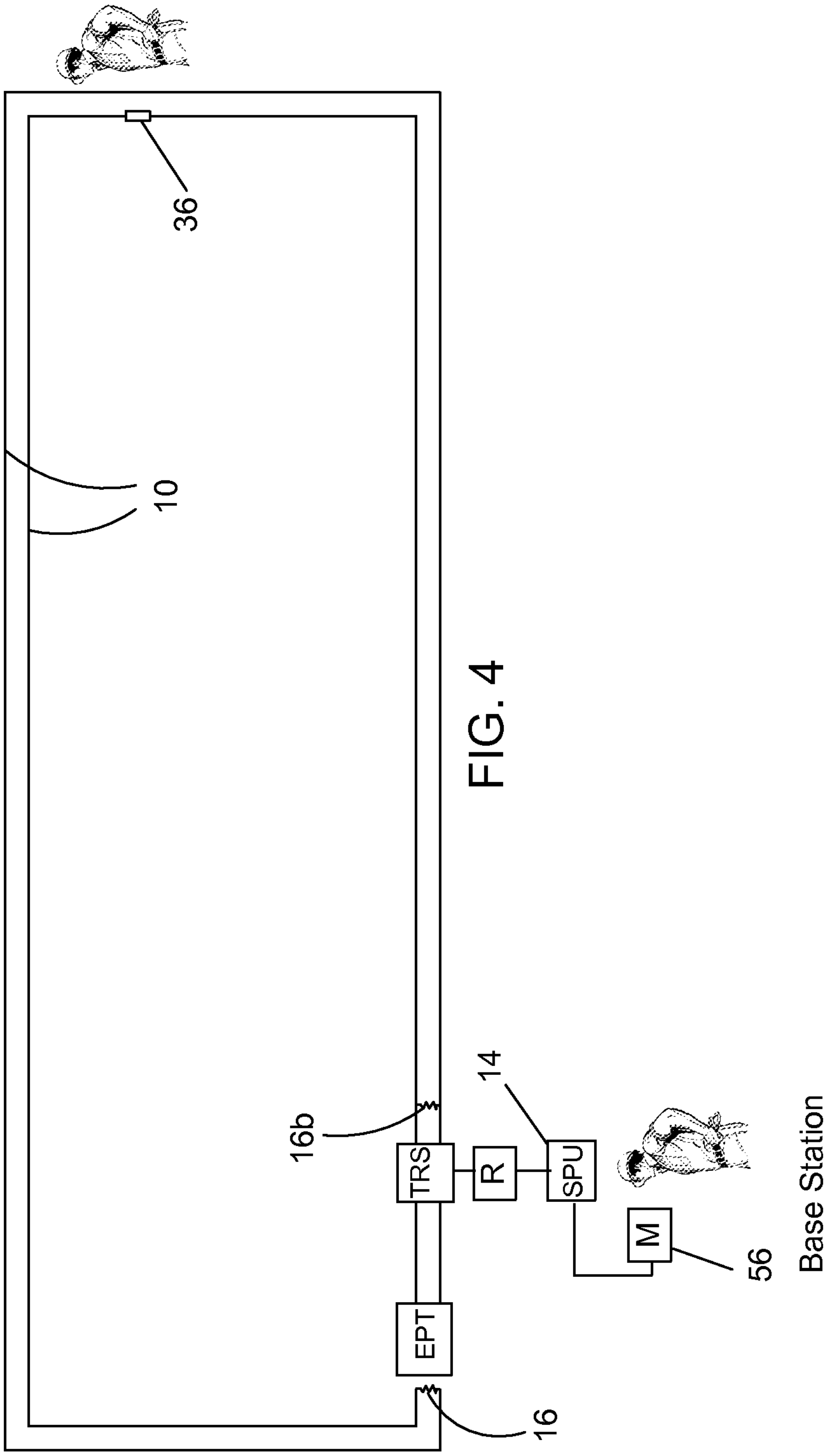
FIG. 4 shows another preferred embodiment of the present invention.
Figure 4B:
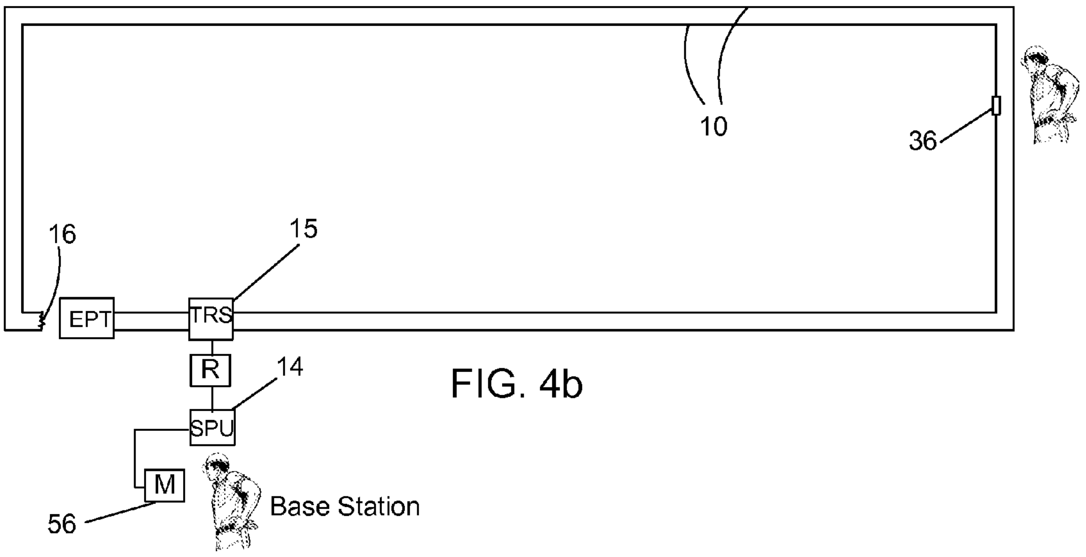
FIG. 4*b* shows another preferred embodiment of the present invention.

In another preferred embodiment of the present invention the transmission line is used to convey an emergency signal to the base station and to provide the base station with the signal sender's location. Since this fence includes a transmission line, an operator can use the transmission line to transmit signals to a base station. For example, if an operator on patrol is patrolling along the fence in a remote area and meets an emergent situation, he may tap transmission line 10 in a patterned manner (i.e., morse code) or connect dedicated device 36 to the wires of the fence (FIG. 4). Device 36 is programmed to send out a coded message along transmission line 10 and also causes an impedance between the two wires so that there will be an impedance mismatch at the point. The coded message and reflected signal can be monitored at monitor 56 at the base station as explained above.

Impedance Matched Load

Figure 4C:
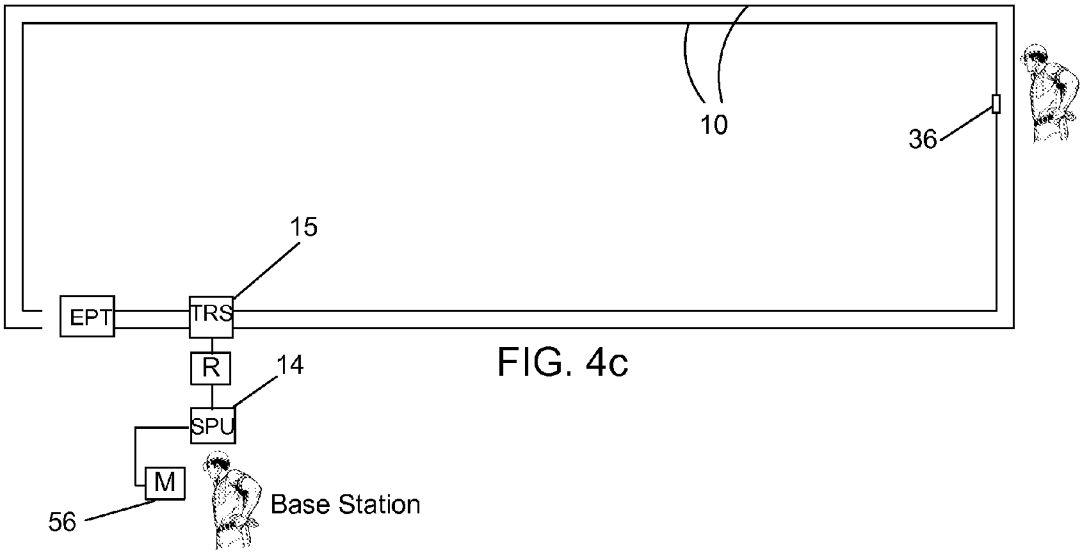
FIG. 4*c* shows another preferred embodiment of the present invention.

As stated above it is possible to omit the impedance matched loads and electric fence 8 will still be effective. For example, in FIG. **4*b* impedance matched load 16*b* (FIG. 2) has been omitted. Likewise, in FIG. 4*c* impedance matched loads 16*b* and 16 (FIG. 2) have both been omitted and transmission line 10 is open as shown. In any of these cases, there will be fixed reflection from the end of transmission line 10** and there will be multiple reflections. Therefore it will be more difficult to detect more than one simultaneous intrusion.

Although the above-preferred embodiments have been described with specificity, persons skilled in this art will recognize that many changes to the specific embodiments disclosed above could be made without departing from the spirit of the invention. For example, although FIG. 1 showed electric fence 8 attached to the top of solid wall 9 it should be understood that electric fence 8 can be installed on posts, or on top of a variety of fence types such as a brick wall, a wood fence, or a metal wire mash. It can also be installed as a stand alone electric fence. Also, a filter network may be inserted between the transmission line to reject electro-magnetic interference from the environment. Also, the electric fence may be combined with conventional electric shock functionality to deter potential intruders. Also, the electric fence may be combined with other security alarms, such as audio detectors, and video cameras. For example, when the electric fence locates an intrusion, it sends out a trigger signal, which sets a microphone or a video camera to work. False alarm rate can be greatly reduced in this way. Also, to enhance the impedance mismatch when only one of the two wires is being touched by an intruder, the other wire may be connected to the ground in the terminal equipment. Since the terminal has no knowledge which wire is being touched, the two wires may be connected to ground in turn by electronic switches, such as those comprised of field effect transistors. The two switches may work in the following way: 1. SW1 close and SW2 open; 2. SW1 open and SW2 close; 3. SW1 and SW2 both open. Therefore, the attached claims and their legal equivalents should determine the scope of the invention.

What is claimed is:

1. An electric security fence, comprising:

A) an electric signal generator for generating an initial electric signal,

B) a transmission line for transmitting said initial electric signal generated by said electric signal generator and for generating a reflected electric signal when said transmission line is disturbed by the presence of a human or animal at a disturbance area, C) a receiver for receiving said reflected electric signal when said transmission line is disturbed by the presence of a human or animal, and D) a signal processing unit for calculating the location of said disturbance area after receiving said reflected electric signal.

2. The electric security fence as in claim 1, wherein said electric signal generator is an electric short pulse transmitter and said generated signal is an electrical pulse.

3. The electric security fence as in claim 1 further comprising a transmit/receive switch to direct said reflected electric signal to said receiver and said signal processing unit.

4. The electric security fence as in claim 1, wherein said presence of a human or animal adds a load impedance to said transmission line to cause the generation of said reflected signal.

5. The electric security fence as in claim 1, wherein said transmission line comprises two symmetric transmission wires wherein said presence of a human or animal is the physical touching one or both wires of said transmission wires by the human or animal.

6. The electric security fence as in claim 1, wherein said transmission line comprises two symmetric transmission wires wherein said presence of a human or animal is the changing of the physical separation between said symmetric transmission wires.

7. The electrical security fence as in claim 1, wherein said signal processing unit calculates the location of disturbance area by determining the amount of time required for said reflected signal to travel from said disturbance area.

8. The electric security fence as in claim 1, wherein said electric signal generator is Frequency Modulated Continuous Wave generator and said generated signal is an initial Frequency Modulated Continuous Wave signal and said reflected signal is a reflected Frequency Modulated Continuous Wave signal.

9. The electrical security fence as in claim 8, wherein said signal processing unit calculates the location of said disturbance area by determining the frequency difference between said initial Frequency Modulated Continuous Wave signal and said reflected Frequency Modulated Continuous Wave signal.

10. The electric security fence as in claim 1 wherein a user transmits a coded message back to said receiver along said transmission line.

11. The electric security fence as in claim 10, wherein said signal processing unit is programmed to decode said coded message and to calculating the location of said disturbance area after receiving said reflected electric signal.

* * * * *